(12) United States Patent
Seddon et al.

(10) Patent No.: US 10,685,891 B2
(45) Date of Patent: *Jun. 16, 2020

(54) SEMICODUCTOR WAFER AND METHOD OF BACKSIDE PROBE TESTING THROUGH OPENING IN FILM FRAME

(71) Applicant: SEMICONDUCTOR COMPONENTS INDUSTRIES, LLC, Phoenix, AZ (US)

(72) Inventors: Michael J. Seddon, Gilbert, AZ (US); Heng Chen Lee, Seremban (MY)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 16/203,570

(22) Filed: Nov. 28, 2018

(65) Prior Publication Data

US 2019/0096777 A1 Mar. 28, 2019

Related U.S. Application Data

(63) Continuation of application No. 15/704,246, filed on Sep. 14, 2017, now Pat. No. 10,170,381, which is a (Continued)

(51) Int. Cl.
*H01L 23/58* (2006.01)
*H01L 29/10* (2006.01)
(Continued)

(52) U.S. Cl.
CPC .......... *H01L 22/34* (2013.01); *G01R 31/2831* (2013.01); *H01L 21/6836* (2013.01); *H01L 21/78* (2013.01); *H01L 22/12* (2013.01); *H01L 22/32* (2013.01); *G01R 31/2865* (2013.01); *H01L 21/304* (2013.01); *H01L 22/14* (2013.01); *H01L 2221/6834* (2013.01); *H01L 2221/68327* (2013.01); *H01L 2221/68381* (2013.01)

(58) Field of Classification Search
USPC ...................................... 257/48; 438/15, 113
See application file for complete search history.

(56) References Cited

U.S. PATENT DOCUMENTS 9,322,879 B2 * 4/2016 Whetsel .......... G01R 31/31854
9,793,186 B1 10/2017 Seddon et al.
(Continued)

*Primary Examiner* — Niki H Nguyen
(74) *Attorney, Agent, or Firm* — Adam R. Stephenson, Ltd.

(57) ABSTRACT

A semiconductor test system has a film frame including a tape portion with one or more openings through the tape portion. The opening is disposed in a center region of the tape portion of the film frame. The film frame may have conductive traces formed on or through the tape portion. A thin semiconductor wafer includes a conductive layer formed over a surface of the semiconductor wafer. The semiconductor wafer is mounted over the opening in the tape portion of the film frame. A wafer probe chuck includes a lower surface and raised surface. The film frame is mounted to the wafer probe chuck with the raised surface extending through the opening in the tape portion to contact the conductive layer of the semiconductor wafer. The semiconductor wafer is probe tested through the opening in the tape portion of the film frame.

18 Claims, 10 Drawing Sheets

Related U.S. Application Data continuation of application No. 15/230,875, filed on Aug. 8, 2016, now Pat. No. 9,793,186.

(51) Int. Cl.
  *H01L 21/66* (2006.01)
  *H01L 21/683* (2006.01)
  *G01R 31/28* (2006.01)
  *H01L 21/78* (2006.01)
  *H01L 21/304* (2006.01)

(56) References Cited

U.S. PATENT DOCUMENTS

| | | | |
|---|---|---|---|
| 10,170,381 B2 * | 1/2019 | Seddon | H01L 21/78 |
| 2013/0076384 A1 | 3/2013 | Chang | |
| 2014/0051189 A1 | 2/2014 | Kai-Jun | |
| 2014/0203829 A1 * | 7/2014 | Yamada | G01R 31/2863 |
| | | | 324/750.08 |
| 2014/0252641 A1 | 9/2014 | Lim et al. | |
| 2015/0001709 A1 * | 1/2015 | Bao | H01L 23/49811 |
| | | | 257/737 |
| 2015/0015288 A1 * | 1/2015 | Ma | G01R 1/06738 |
| | | | 324/754.03 |

* cited by examiner

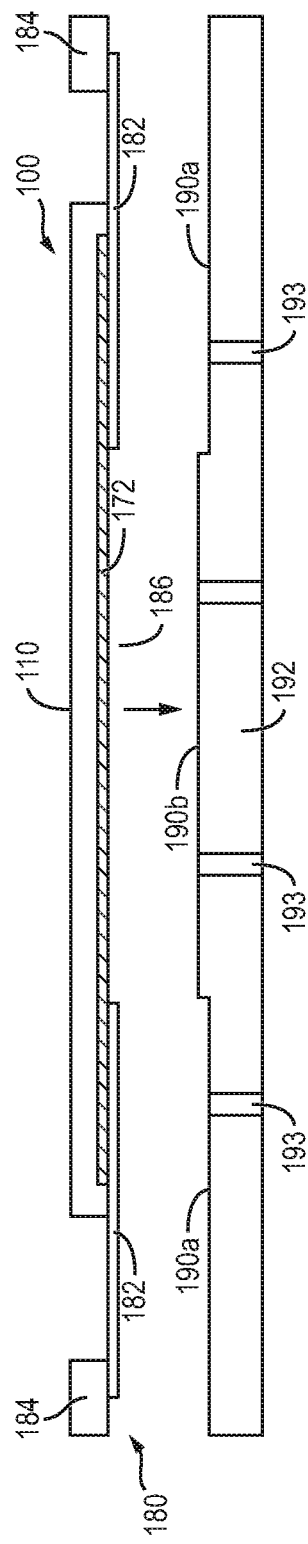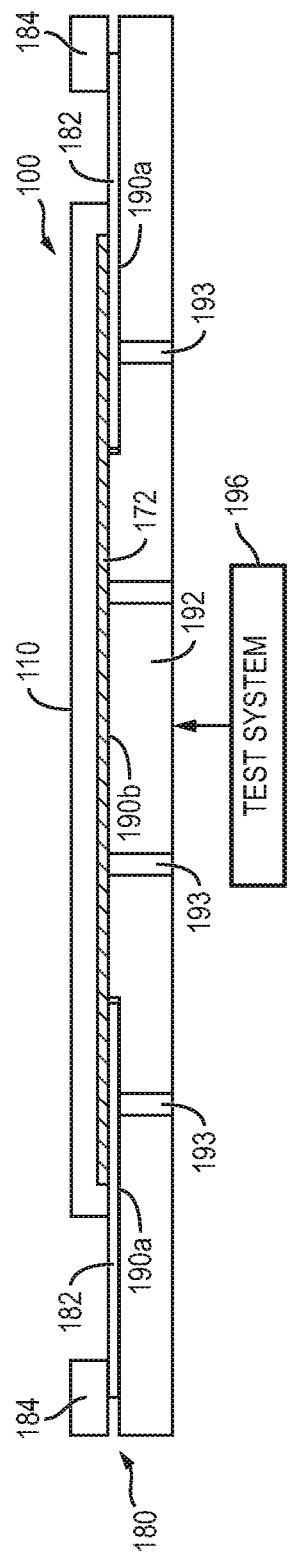

US 10,685,891 B2

SEMICONDUCTOR WAFER AND METHOD OF BACKSIDE PROBE TESTING THROUGH OPENING IN FILM FRAME

CLAIM TO DOMESTIC PRIORITY

The present application is a continuation of U.S. patent application Ser. No. 15/704,246 to Michael Seddon et al., filed Sep. 14, 2017, now pending, which is a continuation of U.S. patent application Ser. No. 15/230,875, filed Aug. 8, 2016, now U.S. Pat. No. 9,793,186 issued on Oct. 17, 2017, the entirety of each of which are herein incorporated by reference.

TECHNICAL FIELD

The present disclosure relates in general to semiconductor devices and, more particularly, to a semiconductor wafer and method of probe testing from a backside of the wafer through one or more openings in a tape portion of a film frame.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), power conversion, standard logic, amplifiers, clock management, memory, interface circuits, and other signal processing circuits.

A semiconductor wafer includes a base substrate material and plurality of semiconductor die formed on an active surface of the wafer separated by a saw street. Many applications require the semiconductor die to be reduced in height or thickness to minimize the size of the semiconductor package. Testing and inspection of the semiconductor wafer is important for quality assurance and reliability. Testing typically involves contacting a surface of the semiconductor wafer with a test probe. Yet, for large thin semiconductor wafers, wafer test probing often leads to breakage or damage from probe pressure on the thin wafer surface, as well as wafer handling and wafer warpage. The thin semiconductor wafers are subject to warpage. A warped thin semiconductor wafer is difficult to test because the test probes may not make contact with the warped surface.

In some cases, wafer test probing is performed prior to wafer thinning because the large thin wafers, e.g., wafers with a diameter of 150-300 millimeters (mm), may be warped beyond the test probe contact tolerance, or because the thin wafer surface cannot handle the invasive nature of the test. Wafer testing prior to wafer thinning is incomplete because certain features that are added post-wafer thinning, e.g., back-side metal, are not present for the test. In addition, for MOSFETS or wafers with through silicon vias, the current flows through the silicon and out the backside of the thinned wafer, i.e. through the back metal. Testing such devices is impractical for full-thickness wafers. The thickness of the wafers also affects the electrical performance. A thicker T-MOSFET wafer has more resistance than a thin wafer since the current must pass through more silicon. Wafer testing and inspection before all features are present reduces quality assurance, and adds manufacturing cost because an untested die must be assembled before functionality can be confirmed.

BRIEF DESCRIPTION OF THE DRAWINGS

FIGS. 3a-3m illustrate a process of probe testing from a backside of the thinned semiconductor wafer through one or more openings in a tape portion of a film frame.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer may contain active and passive electrical components and optical devices, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions. The optical device detects and records an image by converting the variable attenuation of light waves or electromagnetic radiation into electric signals.

Back-end manufacturing refers to cutting or singulating the finished wafer into the individual semiconductor die and packaging the semiconductor die for structural support, electrical interconnect, and environmental isolation. The wafer is singulated using plasma etching, laser cutting tool, or saw blade along non-functional regions of the wafer called saw streets or scribes. After singulation, the individual semiconductor die are mounted to a package substrate that includes pins or interconnect pads for interconnection with other system components. Interconnect pads formed over the semiconductor die are then connected to interconnect pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
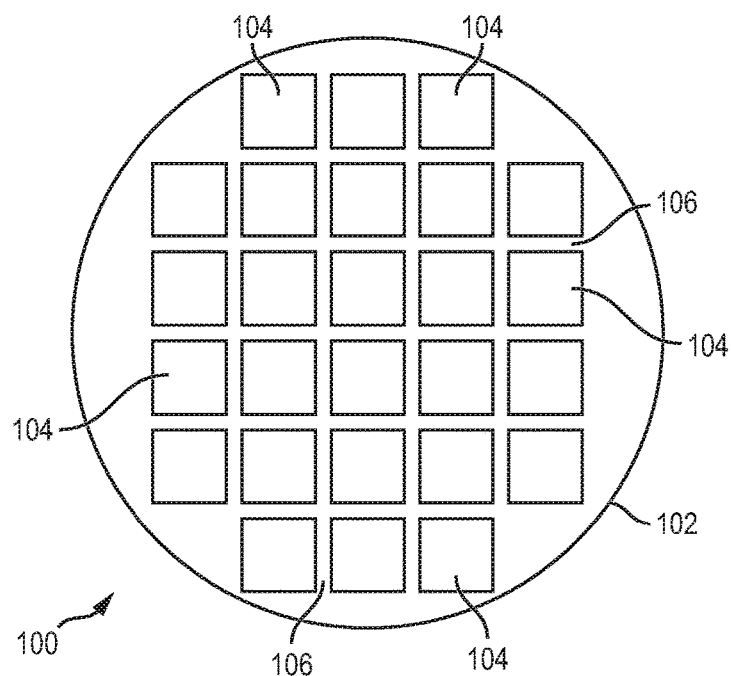
FIGS. 1a-1b illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die 104 is formed on wafer 100 separated by saw street 106, as described above. Saw street 106 provides singulation areas to separate semiconductor wafer 100 into individual semiconductor die 104. In one embodiment, semiconductor wafer 100 has a width or diameter of 100-450 mm and thickness of 675-775 micrometers (μm). In another embodiment, semiconductor wafer 100 has a width or diameter of 150-300 mm.

Figure 1B:
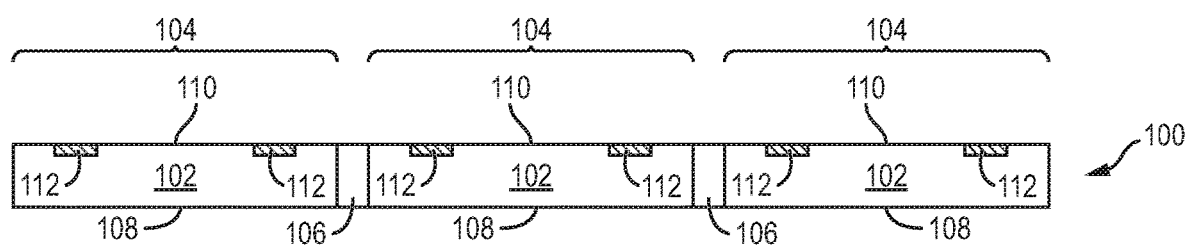

FIG. 1b shows a cross-sectional view of a portion of semiconductor wafer 100. Each semiconductor die 104 has a back surface 108 and an active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits, such as digital signal processor (DSP), microcontrollers, ASIC, power conversion, standard logic, amplifiers, clock management, memory, interface circuits, and other signal processing circuit. Semiconductor die 104 may also contain integrated passive devices (IPDs), such as inductors, capacitors, and resistors, for RF signal processing. Active surface 110 may contain an image sensor area implemented as semiconductor charge-coupled devices (CCD) and active pixel sensors in complementary metal-oxide-semiconductor (CMOS) or N-type metal-oxide-semiconductor (NMOS) technologies. Alternatively, semiconductor die 104 can be an optical lens, detector, vertical cavity surface emitting laser (VCSEL), waveguide, stacked die, electromagnetic (EM) filter, or multi-chip module.

An electrically conductive layer 112 is formed over active surface 110 using PVD, CVD, electrolytic plating, electroless plating process, evaporation, or other suitable metal deposition process. Conductive layer 112 includes one or more layers of aluminum (Al), copper (Cu), tin (Sn), nickel (Ni), gold (Au), silver (Ag), titanium (Ti), titanium tungsten (TiW), or other suitable electrically conductive material. Conductive layer 112 operates as interconnect pads electrically connected to the circuits on active surface 110.

Figure 2A:
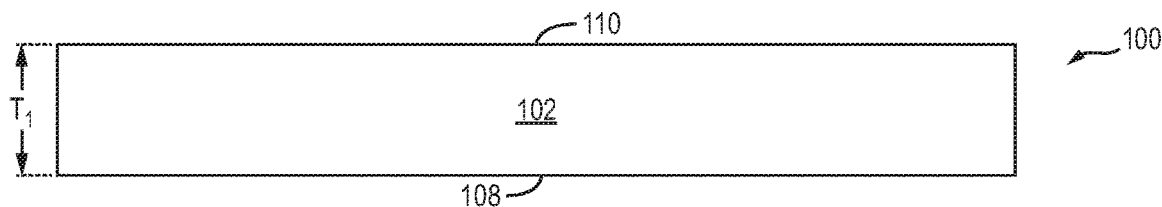
FIGS. 2a-2h illustrate a process of thinning a semiconductor wafer with an edge support ring.

FIGS. 2a-2h illustrate a process of thinning a semiconductor wafer with an edge support ring. FIG. 2a shows an entire area of semiconductor wafer 100 with back surface 108 and active surface 110. Semiconductor die 104 are present in active surface 110, see FIGS. 1a-1b, but not labeled for purposes of the present explanation. Semiconductor wafer 100 has a pre-grinding thickness $T_1$ of 675-775 μm.

Figure 2B:
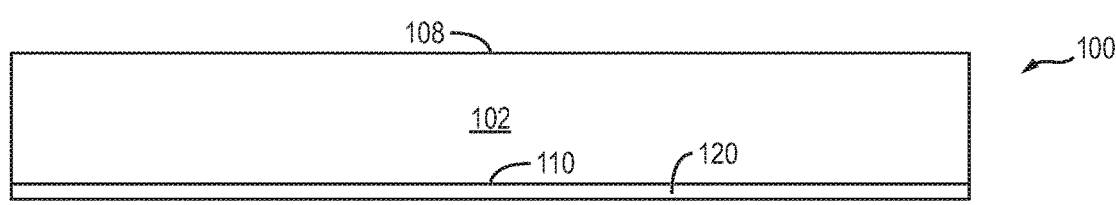
Figure 2C:
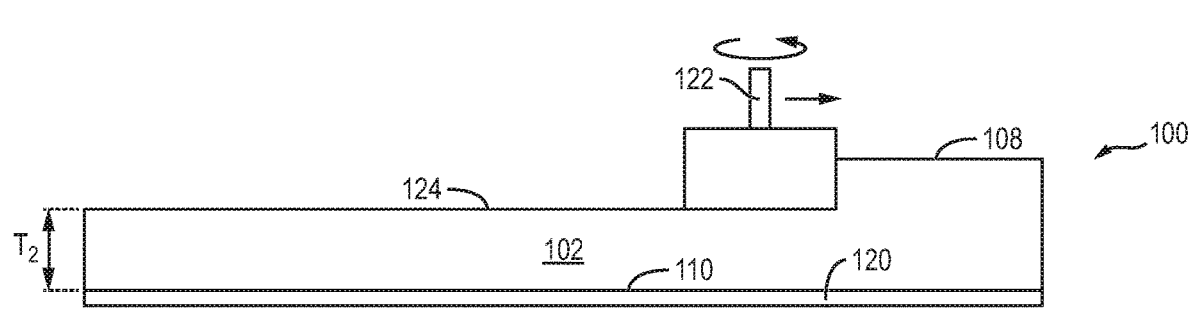

In FIG. 2b, semiconductor wafer 100 is inverted and mounted with active surface 110 oriented to backgrinding tape 120. In FIG. 2c, the entire back surface 108 undergoes a first backgrinding operation with grinder or grinding wheel 122 to remove a portion of base substrate material 102 down to surface 124. Semiconductor wafer 100 has a post-grinding thickness $T_2$ of 355 μm between active surface 110 and surface 124.

Figure 2D:
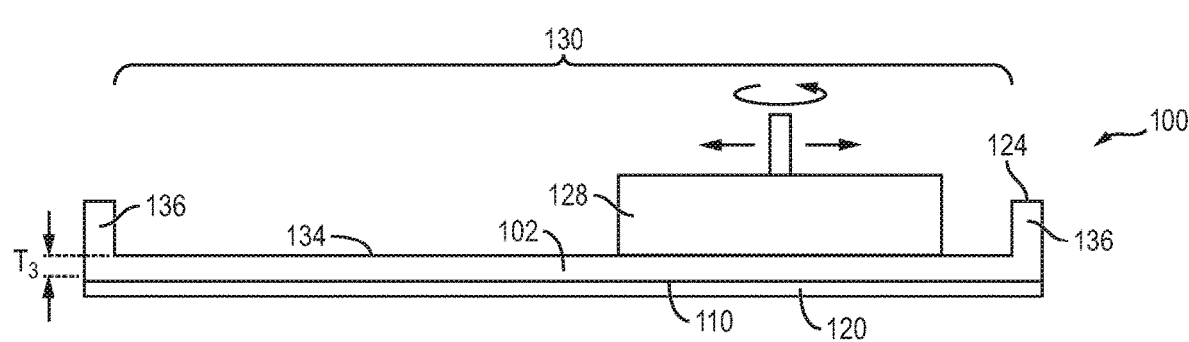

In FIG. 2d, a second grinding operation is applied to surface 124 using grinder or grinding wheel 128. Grinding wheel 128 moves in a cyclic, rotating pattern across an interior region or wafer grinding area 130 of semiconductor wafer 100 to remove a portion of base substrate material 102 down to surface 134. Grinding wheel 128 is controlled to leave edge support ring 136 of base substrate material 102 around a perimeter of semiconductor wafer 100 for structural support. In one embodiment, the post-grinding thickness $T_3$ of semiconductor wafer 100 is 75 μm or less. In another embodiment, the post-grinding thickness $T_3$ of semiconductor wafer 100 is 10-50 μm.

Figure 2E:
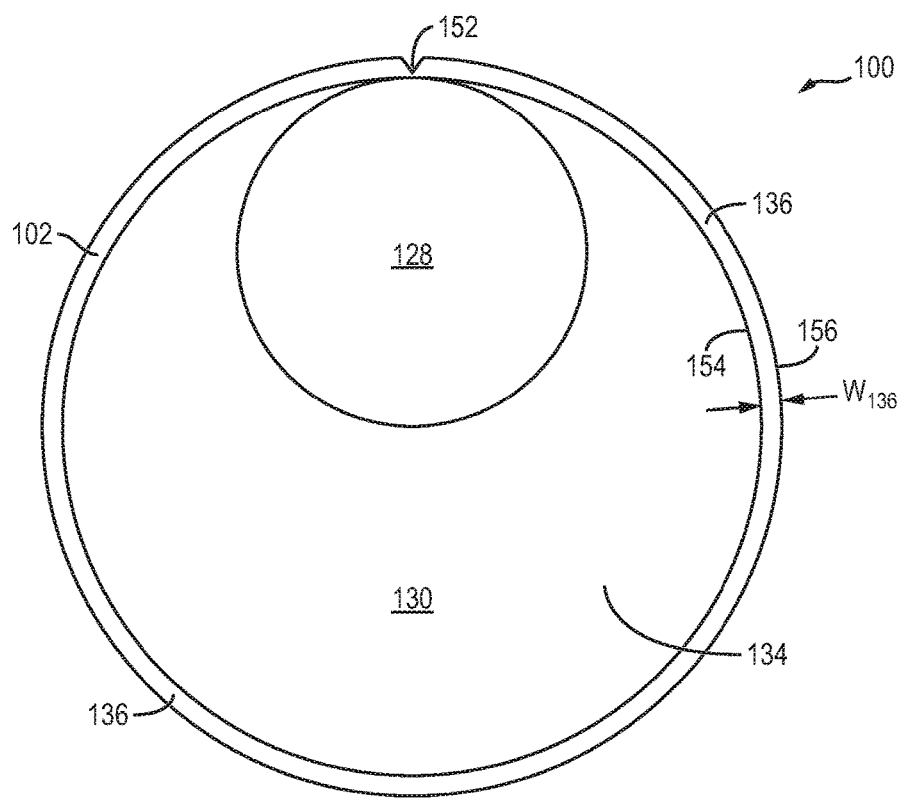

FIG. 2e shows a top view of grinding wheel 128 removing a portion of surface 134 of semiconductor wafer 100 to reduce the thickness of the semiconductor wafer, and correspondingly semiconductor die 104, in grinding area 130, while leaving edge support ring 136 of base substrate material 102 around a perimeter of the semiconductor wafer. Edge support ring 136 has a width $W_{136}$ of 3.0 mm±0.3 mm from inner wall 154 to outer edge 156 around semiconductor wafer 100. The height of edge support ring 136 is the first post-grinding thickness $T_2$, which is greater than the second post-grinding thickness $T_3$ of semiconductor wafer 100, to maintain structural integrity of the thinner semiconductor wafer.

Figure 2F:
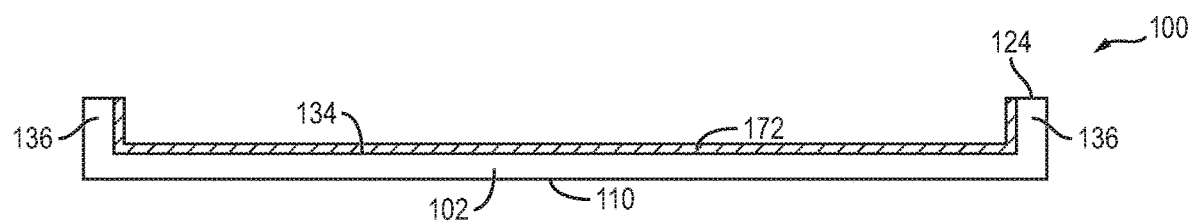

In FIG. 2f, a post-grinding stress relief etch is used to remove or reduce the damage in surface 134 of base substrate material 102 caused by the grinding process. Surface 134 of semiconductor wafer 100 is cleaned with a rinsing solution. An electrically conductive layer 172 is formed over surface 134 using PVD, CVD, electrolytic plating, electroless plating process, evaporation, or other suitable metal deposition process. Conductive layer 172 includes one or more layers of Al, Cu, Sn, Ni, Au, Ag, Ti, TiW, or other suitable electrically conductive material. Conductive layer 172 provides back-side electrical interconnect for semiconductor die 104. Conductive layer 172 is patterned into electrically common or electrically isolated portions according to the function of semiconductor die 104. Backgrinding tape 120 is removed by exposing the tape to ultraviolet (UV) light and peeling off.

Figure 2G:
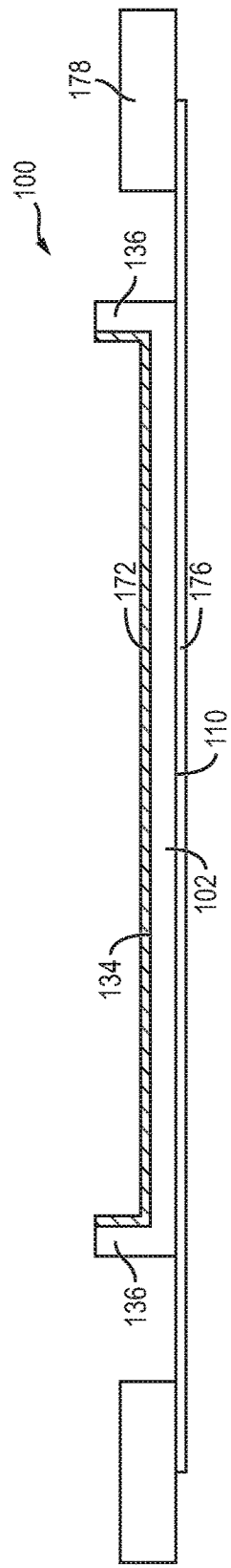
Figure 2H:
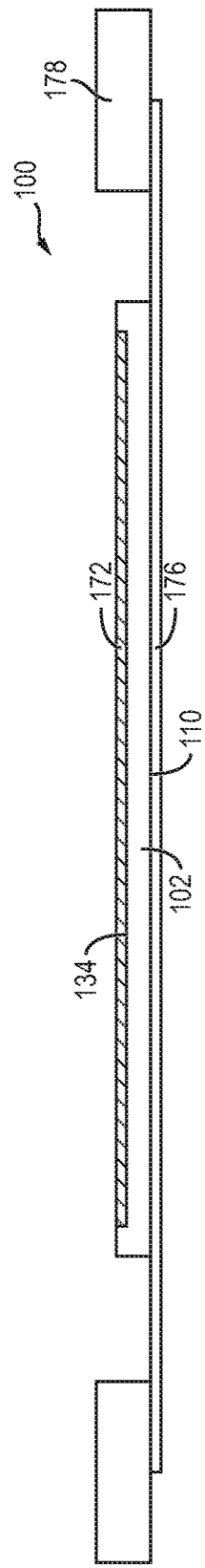

In FIG. 2g, the thinned semiconductor wafer 100 is mounted with active surface 110 oriented to tape portion 176 of film frame or carrier 178. In FIG. 2h, edge support ring 136 is removed to be planar with or just above (10-13 μm) conductive layer 172 or surface 134.

Figure 3A:
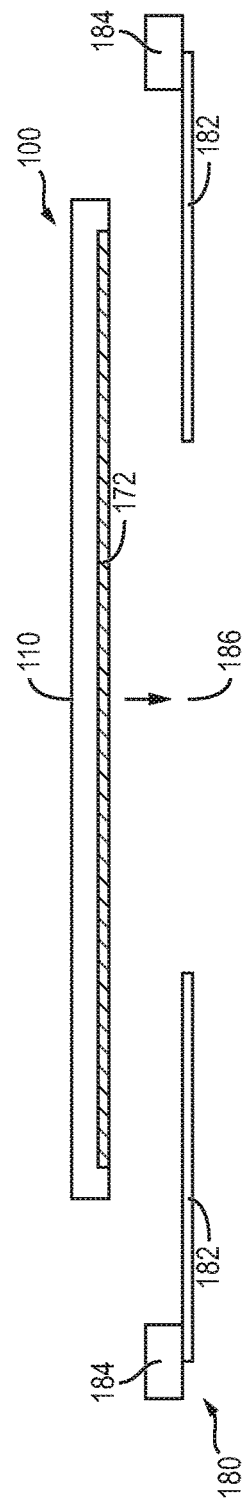
Figure 3B:
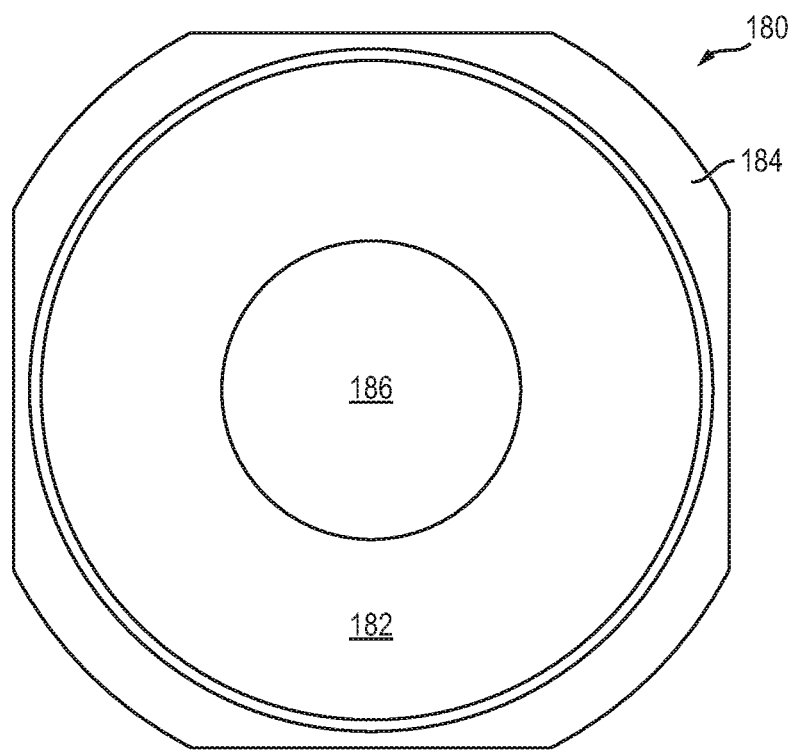
Figure 3C:
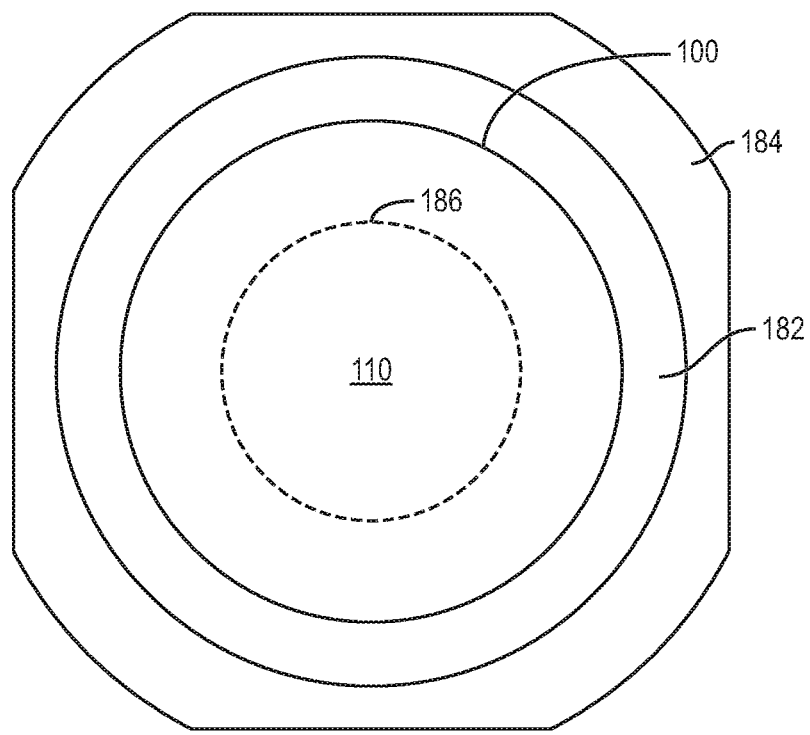

FIGS. 3a-3m illustrate a process of probe testing from a backside of the semiconductor wafer through one or more openings in a tape portion of a film frame. In FIG. 3a, the thinned semiconductor wafer 100 is removed from film frame 178 and positioned above film frame or carrier 180 with conductive layer 172 on surface 134 oriented toward the film frame. Semiconductor die 104 on the thinned semiconductor wafer 100 have a full feature set, i.e., all functional components and layers have been formed, ready for probe testing of the final semiconductor die. Film frame 180 includes a tape portion 182 and edge support 184. In particular, tape portion 182 includes an opening 186 extending through a center region of the tape portion. The thinned semiconductor wafer 100 is positioned over film frame 180 with conductive layer 172 aligned and centered with opening 186. FIG. 3b shows a top view of film frame 180 with tape portion 182 and opening 186 extending through a center region of the tape portion. Semiconductor wafer 100 is mounted to tape portion 182 of film frame 180 with conductive layer 172 disposed over opening 186. FIG. 3c shows a top view of semiconductor wafer 100 mounted to tape portion 182 of film frame 180. Conductive layer 172 is accessible through opening 186 in tape portion 182.

Figure 3F:
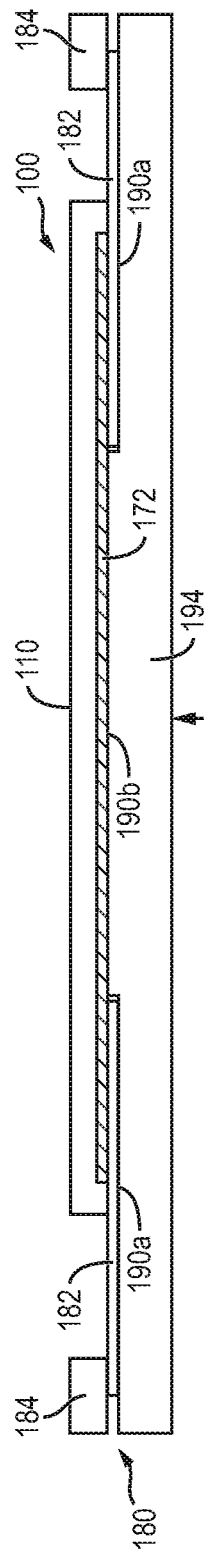
Figure 3G:
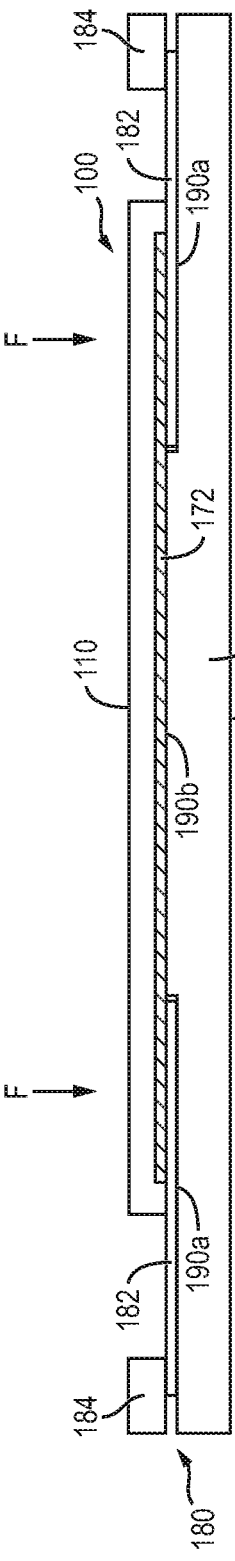

In FIG. 3d, semiconductor wafer 100 and film frame 180 are positioned over surface 190 of wafer probing chuck 194. Surface 190 has a lower portion 190a and a raised portion 190b. The raised portion 190b is aligned with opening 186. FIG. 3e shows film frame 180 with semiconductor wafer 100 mounted to surface 190 of wafer probing chuck 194 with tape portion 182 contacting lower portion 190a of surface 190, and raised portion 190b extending through opening 186 to contact conductive layer 172. In one embodiment, wafer probing chuck 194 draws a vacuum through ports 193 to hold tape portion 182 and semiconductor wafer 100 securely in place with surface 134 and a first portion of conductive layer 172 held flat against and in contact with tape portion 182, tape portion 182 held flat against and in contact with lower portion 190a of surface 190, and a second portion of conductive layer 172 held flat against and in contact with raised portion 190b of surface 190. In FIG. 3f, a porous ceramic chuck 194, with the same surface 190 including lower portion 190a and raised portion 190b, evenly distributes the vacuum forces to hold semiconductor wafer 100 and film frame 180 flat against lower portion 190a and raised portion 190b of surface 190. Semiconductor wafer 100 and film frame 180 being held flat against lower portion 190a and raised portion 190b of surface 190 by vacuum ports 193 or porous chuck 194 keeps the wafer stable and planar during probe testing. Alternatively, tape portion 182 and semiconductor wafer 100 are held securely in place by a press-fit with force F, as shown in FIG. 3g, with surface 134 and a first portion of conductive layer 172 held flat against and in contact with tape portion 182, tape portion 182 held flat against and in contact with lower portion 190a of surface 190 of chuck 195, and a second portion of conductive layer 172 held flat against and in contact with raised portion 190b of surface 190. Chuck 195 has the same surface 190 with lower portion 190a and raised portion 190b.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, metallurgical microscope, or optical microscope. Semiconductor wafer 100 is inspected for structural characteristics including warpage, thickness variation, surface particulates, irregularities, cracks, delamination, contamination, and discoloration.

The active and passive components within semiconductor die 104 undergo testing at the wafer level for electrical performance and circuit function. Each semiconductor die 104 is tested for functionality and electrical parameters. The raised portion 190b of surface 190 of wafer probing chuck 194 makes electrical contact with conductive layer 172 through opening 186. A computer controlled test system 196 sends electrical test signals through wafer probing chuck 194 and raised portion 190b of surface 190, which extends through opening 186, to provide electrical stimuli to conductive layer 172. Alternatively, computer controlled test system 196 sends electrical test signals through conductive channels within wafer probing chuck 194 and raised portion 190b of surface 190 to provide electrical stimuli to conductive layer 172. Conductive layer 172 is coupled to circuits on active surface 110 through conductive vias or vertically formed semiconductor devices. Semiconductor die 104 responds to the electrical stimuli, which is measured by computer test system 196 and compared to an expected response to test functionality of the semiconductor die.

The testing of semiconductor wafer 100 from the backside directly to conductive layer 172 is achieved through raised portion 190b of surface 190 of wafer probing chuck 194 extending through opening 186 in tape portion 182 of film frame 180. Many testing procedures can be accomplished with wafer probe contact of raised portion 190b to conductive layer 172. For example, the electrical tests may include circuit functionality, lead integrity, resistivity, continuity, reliability, junction depth, ESD, RF performance, drive current, threshold current, leakage current, and operational parameters specific to the component type. The testing is conducted with the thinned semiconductor wafer 100 after wafer grinding. The thinned semiconductor wafer 100 remains flat and stable by nature of lower portion 190a and raised portion 190b of surface 190 of wafer probing chuck 194 held against conductive layer 172. The inspection and electrical testing of semiconductor wafer 100, after wafer thinning, enables semiconductor die 104, with a complete feature set that passes, to be designated as known good die for use in a semiconductor package.

Figure 3H:
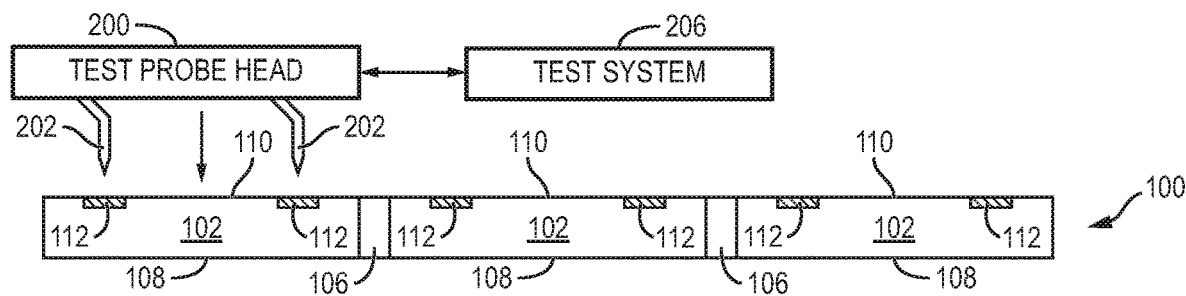

Semiconductor wafer 100 can also be tested from active surface 110, as shown in FIG. 3h. Each semiconductor die 104 is tested for functionality and electrical parameters using a test probe head 200 including a plurality of probes or test leads 202, or other testing device. Probes 202 are used to make electrical contact with nodes or conductive layer 112 on each semiconductor die 104 and provide electrical stimuli to interconnect pads 112. Semiconductor die 104 responds to the electrical stimuli, which is measured by computer test system 206 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as known good die for use in a semiconductor package.

Figure 3I:
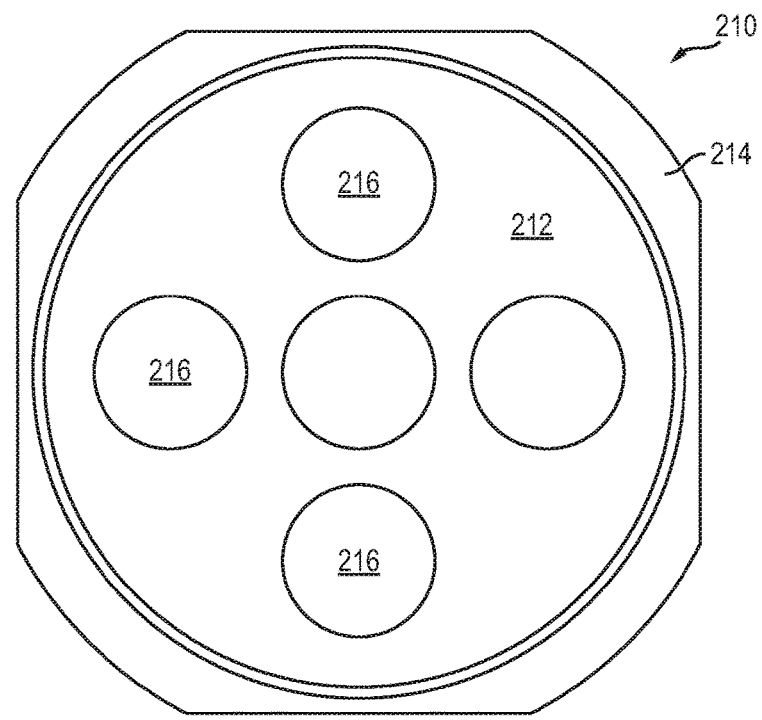
Figure 3J:
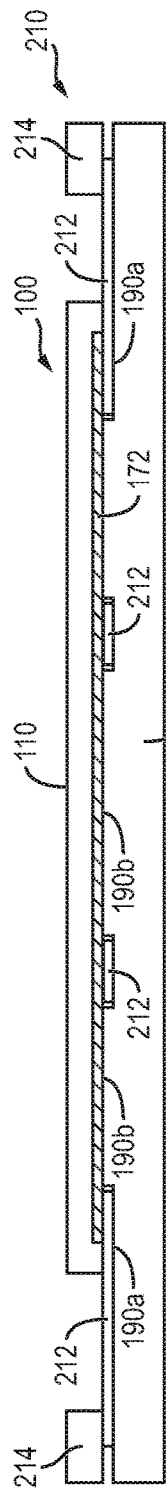

In another embodiment, the film frame may have multiple openings to provide access to different areas of the conductive layer. As noted above, conductive layer 172 is patterned into electrically common or electrically isolated portions according to the function of semiconductor die 104. FIG. 3i shows a top view of film frame 210 including tape portion 212, edge support 214, and multiple openings 216. Tape portion 212 has as many openings 216 as necessary to perform testing of requisite areas of conductive layer 172. In this case, wafer probing chuck 194 would have multiple raised portions 190b aligned with openings 216. FIG. 3j shows film frame 210 with semiconductor wafer 100 mounted to surface 190 of wafer probing chuck 194 with tape portion 212 contacting lower portion 190a of surface 190 and multiple raised portion 190b extending through multiple openings 216 to contact different areas of conductive layer 172. Tape portion 212 and semiconductor wafer 100 are held securely in place by a press-fit or vacuum assist with surface 134 and first portions of conductive layer 172 held flat against and in contact with tape portion 212, tape portion 212 held flat against and in contact with lower portion 190a of surface 190, and second portions of conductive layer 172 held flat against and in contact with raised portion 190b of surface 190. Semiconductor wafer 100 and film frame 210 being held flat against lower portions 190a and raised portions 190b of surface 190 by press-fit or vacuum assist keeps the wafer stable and planar during probe testing.

The multiple raised portions 190b of surface 190 of wafer probing chuck 194 make electrical contact with corresponding areas of conductive layer 172 through openings 216. A computer controlled test system 220 sends electrical test signals through wafer probing chuck 194 and raised portions 190b of surface 190, which extends through openings 216, to provide electrical stimuli to different areas of conductive layer 172. Semiconductor die 104 responds to the electrical stimuli, which is measured by computer test system 220 and compared to an expected response to test functionality of the semiconductor die.

Figure 3K:
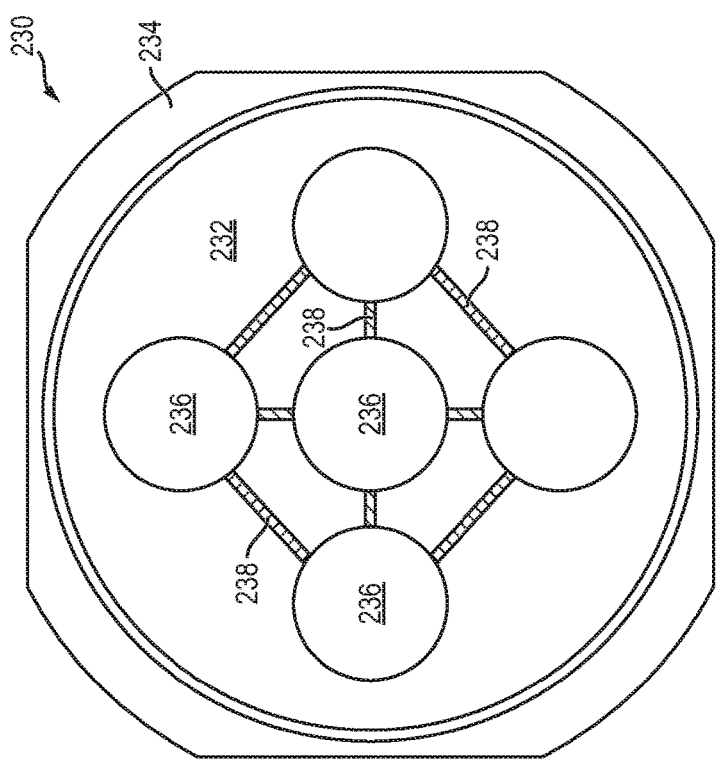
Figure 3L:
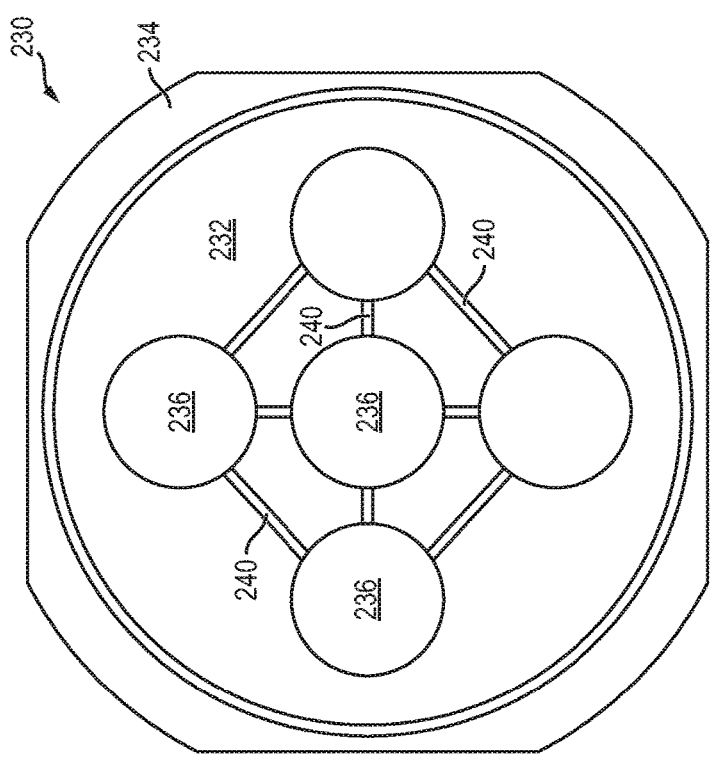

In another embodiment, similar to FIGS. 3i-3j, the film frame may have multiple openings and conductive traces or channels formed in the tape portion of the film frame to provide access to different areas of the conductive layer. FIG. 3k shows a top view of film frame 230 including tape portion 232, edge support 234, and multiple openings 236. Conductive traces 238 formed on the surface of tape portion 232 or formed through the tape portion. Alternatively, tape portion 232 may be made with channels of conductive carbon 240, as shown in FIG. 3l. Tape portion 232 has as many openings 236 and conductive traces 238 or channels 240 as necessary to perform testing of requisite areas of conductive layer 172. In another embodiment, any portion or the entire tape portion 232 may be conductive to perform testing of requisite areas of conductive layer 172. Tape portion 232 and semiconductor wafer 100 are held securely in place by a press-fit or vacuum assist with surface 134 and first portions of conductive layer 172 held flat against and in contact with tape portion 232, tape portion 232 held flat against and in contact with lower portion 190a of surface 190, and second portions of conductive layer 172 held flat against and in contact with raised portion 190b of surface 190. Semiconductor wafer 100 and film frame 230 being held flat against lower portions 190a and raised portions 190b of surface 190 by press-fit or vacuum assist keeps the wafer stable and planar during probe testing.

Figure 3M:
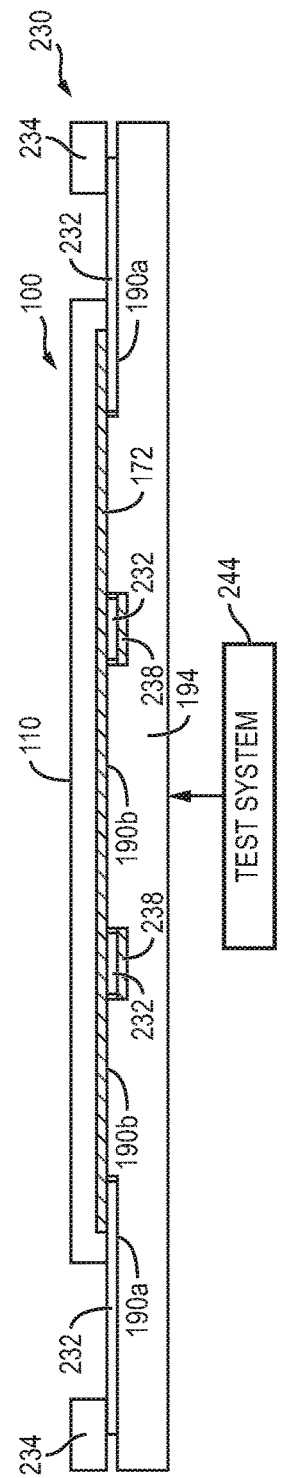

In FIG. 3m, the multiple raised portions 190b of surface 190 of wafer probing chuck 194 make electrical contact with corresponding areas of conductive layer 172 through openings 236 and conductive traces 238 or channels 240. Computer controlled test system 244 sends electrical test signals through wafer probing chuck 194 and raised portions 190b of surface 190, which extends through openings 236, to provide electrical stimuli through conductive traces 238 or channels 240 to different areas of conductive layer 172. Semiconductor die 104 responds to the electrical stimuli, which is measured by computer test system 244 and compared to an expected response to test functionality of the semiconductor die.

The film frame and semiconductor wafer 100 are moved from wafer probing chuck 194 and the thinned semiconductor wafer 100 is singulated through saw streets 106 using a saw blade or laser cutting tool or plasma etch into individual semiconductor die 104. The individual semiconductor die 104 from the thinned semiconductor wafer 100 have been probe tested in the final configuration of the semiconductor die.

While one or more embodiments have been illustrated and described in detail, the skilled artisan will appreciate that modifications and adaptations to those embodiments may be made without departing from the scope of the present disclosure.

What is claimed:

1. A method of making a semiconductor device, comprising:
providing a semiconductor wafer including a first side and a second side, wherein the first side comprises a plurality of semiconductor devices formed therein;
forming a conductive layer over the second side;
providing a wafer holder;
forming a first opening through the wafer holder;
mounting the semiconductor wafer to the wafer holder with the conductive layer on the second side oriented toward the wafer holder; and
probe testing the semiconductor wafer by contacting the conductive layer through the first opening in the wafer holder.

2. The method of claim 1, wherein the wafer holder includes a tape portion with the first opening formed in the tape portion.

3. The method of claim 1, further including:
providing a wafer probe chuck including a raised surface; and
mounting the wafer holder to the wafer probe chuck with the raised surface extending through the first opening in the wafer holder.

4. The method of claim 1, further including forming a plurality of openings through the wafer holder.

5. The method of claim 1, further including mounting the semiconductor wafer to the wafer holder after forming the first opening through the wafer holder.

6. The method of claim 1, further including forming the first opening through the wafer holder after mounting the semiconductor wafer to the wafer holder.

7. A method of making a semiconductor device, comprising:
providing a semiconductor wafer comprising a first side and a second side opposite the first side, wherein the first side comprises a plurality of semiconductor devices therein;
providing a wafer holder;
forming a first opening through the wafer holder;
mounting the semiconductor wafer to the wafer holder with the second side of the semiconductor wafer oriented toward the wafer holder; and
probe testing the semiconductor wafer by contacting the second side of the semiconductor wafer through the first opening in the wafer holder;
wherein the wafer holder includes a tape portion with the first opening formed in the tape portion.

8. The method of claim 7, further including:
forming a conductive layer over the second side of the semiconductor wafer; and
probe testing the semiconductor wafer by contacting the conductive layer through the first opening in the wafer holder.

9. The method of claim 7, further including:
providing a wafer probe chuck including a raised surface; and
mounting the wafer holder to the wafer probe chuck with the raised surface extending through the first opening in the wafer holder.

10. The method of claim 7, further including forming a plurality of openings through the wafer holder.

11. The method of claim 7, further including mounting the semiconductor wafer to the wafer holder after forming the first opening through the wafer holder.

12. The method of claim 7, further including forming the first opening through the wafer holder after mounting the semiconductor wafer to the wafer holder.

13. An apparatus for probe testing a semiconductor wafer comprising a first side and a second side opposite the first side, wherein the first side comprises of plurality of semiconductor devices therein, the apparatus comprising:
a wafer holder with a first opening formed through the wafer holder, wherein the second side of the semiconductor wafer is disposed over the first opening in the wafer holder to probe test the semiconductor wafer through the first opening in the wafer holder by contacting the second side of the semiconductor wafer;

the wafer holder includes a tape portion with the first opening formed in the tape portion.

14. The apparatus of claim 13, further including a conductive layer formed over the second side of the semiconductor wafer.

15. The apparatus of claim 13, further including a wafer probe chuck including a raised surface, wherein the wafer holder is disposed over the wafer probe chuck with the raised surface extending through the first opening in the wafer holder.

16. The apparatus of claim 13, further including a plurality of openings formed through the wafer holder.

17. The apparatus of claim 13, wherein a thickness of the semiconductor wafer is less than 75 micrometers.

18. The apparatus of claim 13, further including a conductive trace formed in or on the wafer holder.

* * * * *